(12) United States Patent
Schuette

(10) Patent No.: US 8,488,389 B2
(45) Date of Patent: Jul. 16, 2013

(54) FLASH MEMORY DEVICE AND METHOD OF OPERATION

(75) Inventor: Franz Michael Schuette, Colorado Springs, CO (US)

(73) Assignee: OCZ Technology Group Inc., San Jose, CA (US)

( * ) Notice: Subject to any disclaimer, the term of this patent is extended or adjusted under 35 U.S.C. 154(b) by 140 days.

(21) Appl. No.: 13/088,450

(22) Filed: Apr. 18, 2011

(65) Prior Publication Data

US 2011/0255337 A1   Oct. 20, 2011

Related U.S. Application Data

(60) Provisional application No. 61/324,974, filed on Apr. 16, 2010.

(51) Int. Cl.
*G11C 16/04* (2006.01)
(52) U.S. Cl.
USPC ............... 365/185.29; 365/185.17; 365/185.3

(58) Field of Classification Search
USPC ............... 365/185.3, 185.17, 185.29, 185.33, 365/185.18
See application file for complete search history.

(56) References Cited

U.S. PATENT DOCUMENTS 5,617,359 A * 4/1997 Ninomiya ................ 365/185.29
7,403,427 B2   7/2008 Chen
7,457,166 B2 * 11/2008 Hemink et al. .......... 365/185.29

* cited by examiner

*Primary Examiner* — David Lam
(74) *Attorney, Agent, or Firm* — Hartman Global IP, Law; Gary M. Hartman; Domenica N. S. Hartman

(57) ABSTRACT

A NAND flash memory device and method of erasing memory cells thereof, wherein each cell is only subjected to the level of erase voltage needed to restore its nominal "erased" state. Each memory cell of the NAND flash memory device comprises a floating gate, a control gate connected to a wordline and receives a control voltage therefrom to induce a programming charge on the floating gate, and a bitline adapted to apply an erase voltage to deplete the floating gate of the programming charge. Each memory cell further includes circuitry for modulating the erase voltage according to the level of the programming charge on its floating gate.

20 Claims, 2 Drawing Sheets

FLASH MEMORY DEVICE AND METHOD OF OPERATION

CROSS REFERENCE TO RELATED APPLICATIONS

This application claims the benefit of U.S. Provisional Application No. 61/324,974 filed Apr. 16, 2010. The contents of this prior application are incorporated herein by reference.

BACKGROUND OF THE INVENTION

The present invention generally relates to flash memory devices. More particularly, this invention relates to a method and circuitry for the erasing of flash memory cells in order to reduce stress conditions on the tunnel oxide layer of the memory cells and to prevent over-erasing of the memory cells. The erase current is adjusted on a per-cell basis and uses the state of the cell's floating gate to control the erase charge.

As known in the art, flash memory is a type of nonvolatile solid-state memory technology. Flash memory components store information in an array of floating-gate transistors, referred to as cells. NAND flash cells are organized in what are commonly referred to as pages, which in turn are organized in predetermined sections of the component referred to as memory blocks (or sectors). Each cell of a NAND flash memory component has a top or control gate (CG) and a floating gate (FG), the latter being sandwiched between the control gate and the channel of the cell. The floating gate is separated from the control gate by an oxide layer and from the channel by another oxide layer, referred to as the tunnel oxide. Data are stored in a NAND flash cell in the form of a charge on the floating gate which, in turn, defines the channel properties of the NAND flash cell by either augmenting or opposing the charge of the control gate. The process of programming (writing 0's to) a NAND cell requires applying a programming charge to the floating gate by applying a programming voltage to the control gate, which causes the injection of electrons into the floating gate by quantum mechanical tunneling. The process of erasing (writing 1's to) a NAND cell requires removing the programming charge from the floating gate by applying an erase voltage to the device substrate, which pulls electrons from the floating gate. Data are stored, retrieved and erased on a block-by-block basis.

To illustrate, FIG. 1 schematically represents a page of a NAND flash device with memory cells daisy-chained in series. Erasing of the memory cells is accomplished by applying, for example, a 20V erase voltage to a page by closing the bitline select and the ground select transistors ("Bitline Select" and "Ground Select"), thereby forcing the 20V erase voltage on the bitline ("Bitline") to pass through the control gates ("CG"), which exerts a Fowler-Nordheim field to deplete the floating gate ("FG") of any program charge.

In single-level cell (SLC) NAND flash devices, the data storage, retrieval and erase technique described above works adequately. However, often an undesired side effect is that the global erase of all cells in one block does not take into account any physical variability between the floating gates of the individual cells, nor does it take into account the different levels of charge of the floating gate in the pre-erase state. Together, the two factors can lead to what is called over-erase or deep depletion of a NAND flash cell's floating gate.

Over-erasing means that, compared to a given baseline level of the floating gate at which the gate transistor returns an "erased" ("closed") value, the floating gate becomes deep-depleted of electrons. If this happens, a nominal programming charge (electron injection) into the floating gate through the control gate will typically result in a "stuck bit," that is, a very slow-to-program cell that can result in the cell and, by extension, its entire block being marked as "bad."

In the case of multi-level cell (MLC) NAND flash, the charge distribution levels are substantially narrower than in the case of SLC NAND flash. In the case of a 2 bit/cell MLC flash device, it is necessary to precisely program four different levels in order to store data. In this case, over-erasing of individual cells can result in catastrophic corruption of data. It is therefore of utmost importance to level the erase state of all cells to the same level. Techniques that have been proposed to achieve this even-leveling effect include decreasing the erase-block size to single word lines or partial blocks, and then applying word line stress or using staggered voltage levels, that is, by applying a pre-erase voltage lower than the target erase voltage. Such a technique is disclosed in U.S. Pat. No. 7,403,427, and is largely directed to solving the problem of over-erasing of single cells. There is an ongoing need for other approaches, for example, to reduce stress on the tunnel oxide layer by preventing exposure to excessive levels of erase voltages.

BRIEF DESCRIPTION OF THE INVENTION

The present invention provides a NAND flash memory device and a method of erasing memory cells thereof in which each cell is only subjected to the level of erase voltage needed to restore its nominal "erased" state.

According to a first aspect of the invention, a NAND memory device is provided that comprises at least one memory cell. The memory cell comprises a floating gate, a control gate connected to a wordline and receives a control voltage therefrom to induce a programming charge on the floating gate, and a bitline adapted to apply an erase voltage to deplete the floating gate of the programming charge. The memory cell further includes means for modulating the erase voltage according to the level of the programming charge on the floating gate.

According to a second aspect of the invention, a method is provided for operating a NAND flash memory device having a memory cell comprising a floating gate, a control gate connected to a wordline to receive a control voltage therefrom and induce a programming charge on the floating gate, and a bitline adapted to apply an erase voltage to deplete the floating gate of the programming charge. The method entails decreasing the erase voltage if the control voltage is below a threshold level to avoid over-erasing of the floating gate.

From the above, it should be evident that a technical effect of this invention is the ability to modulating the erase voltage applied to a NAND flash memory cell in order to avoid deep depletion or over-erasing of its floating gate, as well as unnecessary exposures to erase pulses. The result is lower overall stress on the memory cell with the direct effect of higher endurance and the complete avoidance of over-erasing of individual cells.

According to a preferred aspect of the invention, the intrinsic properties of each memory cell (including process variabilities) can be taken into account, as well as the pre-existing programmed level of each cell so that each memory cell is subjected to only the level of erase voltage needed to restore its nominal "erased" state. In short, the erase voltage becomes a function of the programming level of a floating gate. If the floating gate is fully erased, it only needs a very low programming voltage to switch to the "On" state. If the floating gate is fully programmed, it will need a higher voltage to be turned "On." As a particular example, the programming state of the floating gate can be used to modulate the erase voltage on a per-cell basis using a parallel bypass on a per-cell basis in the erase-voltage path, with the result that a fully-programmed cell will be subjected to a high erase pulse, whereas a partially or non-programmed cell will be subjected to a lower erase pulse.

Other aspects and advantages of this invention will be better appreciated from the following detailed description.

DETAILED DESCRIPTION OF THE INVENTION

The present invention is generally applicable to computers and other processing apparatuses that utilize or are capable of using nonvolatile (permanent) memory-based mass storage devices, and more particularly to solid-state drives (SSDs) that make use of NAND flash memory devices.

Figure 1:
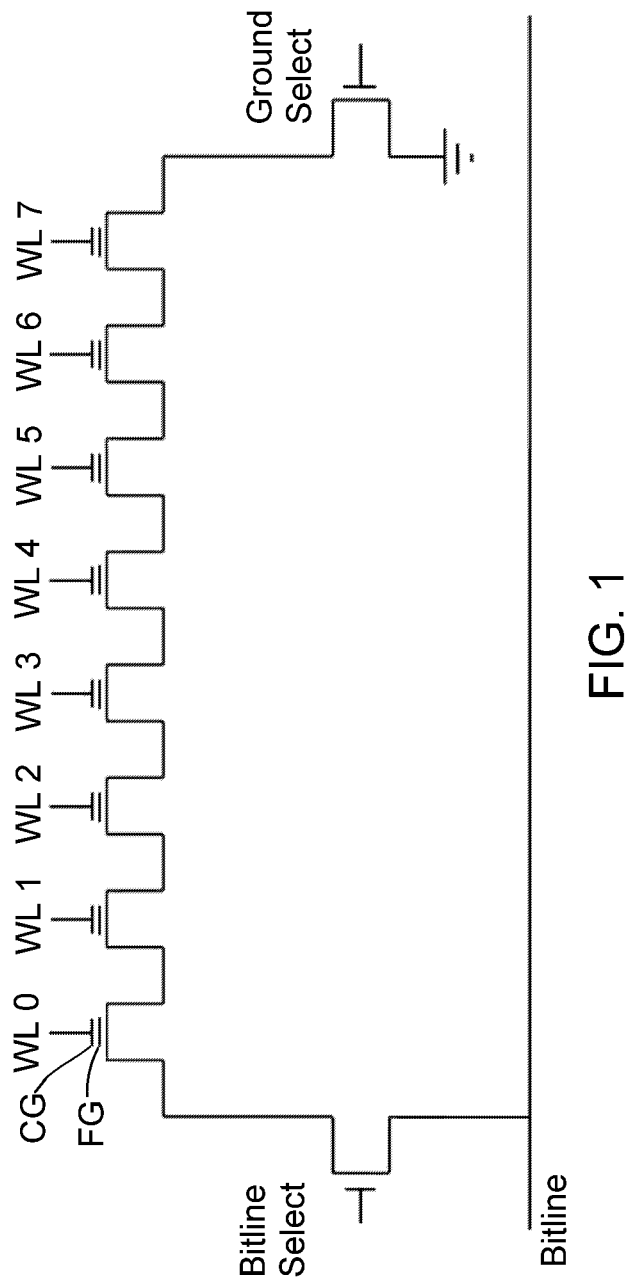
FIG. 1 schematically represents a NAND flash page with memory cells daisy-chained in series in accordance with the prior art.

As discussed above, a conventional NAND flash memory device is erased by subjecting an entire block (containing pages of memory cells) to an erase voltage, typically 20V. As was discussed in reference to FIG. 1, the erase voltage is applied to all serial chains of gates forming a block after the chain a serial chain of gates forming a page after the page has been selected using a "Bitline Select" transistor to apply the erase voltage to the Bitline. All cells within the block are treated equally and subjected to the same Fowler-Nordheim field, regardless of the existing level of charge distribution in the floating gates of the individual cells. Depending on the particular design of the NAND flash memory device, a partial or full block erase may be performed by applying the erase voltage to a fraction of pages or all of the pages within a block.

Different programming levels of the floating gates within a page results in the floating gates being charged to different levels. In turn, this means that different levels of Fowler-Nordheim fields will be sufficient to deplete a given floating gate to the "erased" level. Accordingly, the release of charges via quantum mechanical tunneling from the floating gates of a page will require different levels of erase pulses, that is, lower programming levels (fewer electrons) will diffuse through the tunnel oxide faster than higher levels of charge. Any erase cycle, however, is required to erase all cells, regardless of how much charge is contained by a floating gate within the page. In the case where all cells within a page are fully programmed, the non-descript erase approach described above is unproblematic. However, especially in the case of a solid-state drive that makes use of multi-level cell (MLC) NAND flash memory devices, differences in charge distribution between cells can be substantial. As a consequence, an erase pulse that is uniformly applied in accordance with prior practices (FIG. 1) can have the following undesirable consequences. First, partially programmed cells are erased with a higher voltage than required, with the result that a substantial amount of energy is wasted since, once a cell is erased and there is no charge left in its floating gate, there is no benefit to applying additional erase voltage to the transistor base. Second, the continuous application of the erase voltage to a cell that was only partially programmed causes the cell to over-erase, that is, it goes into "deep depletion" and develops "holes" in the floating gate.

Figure 2:
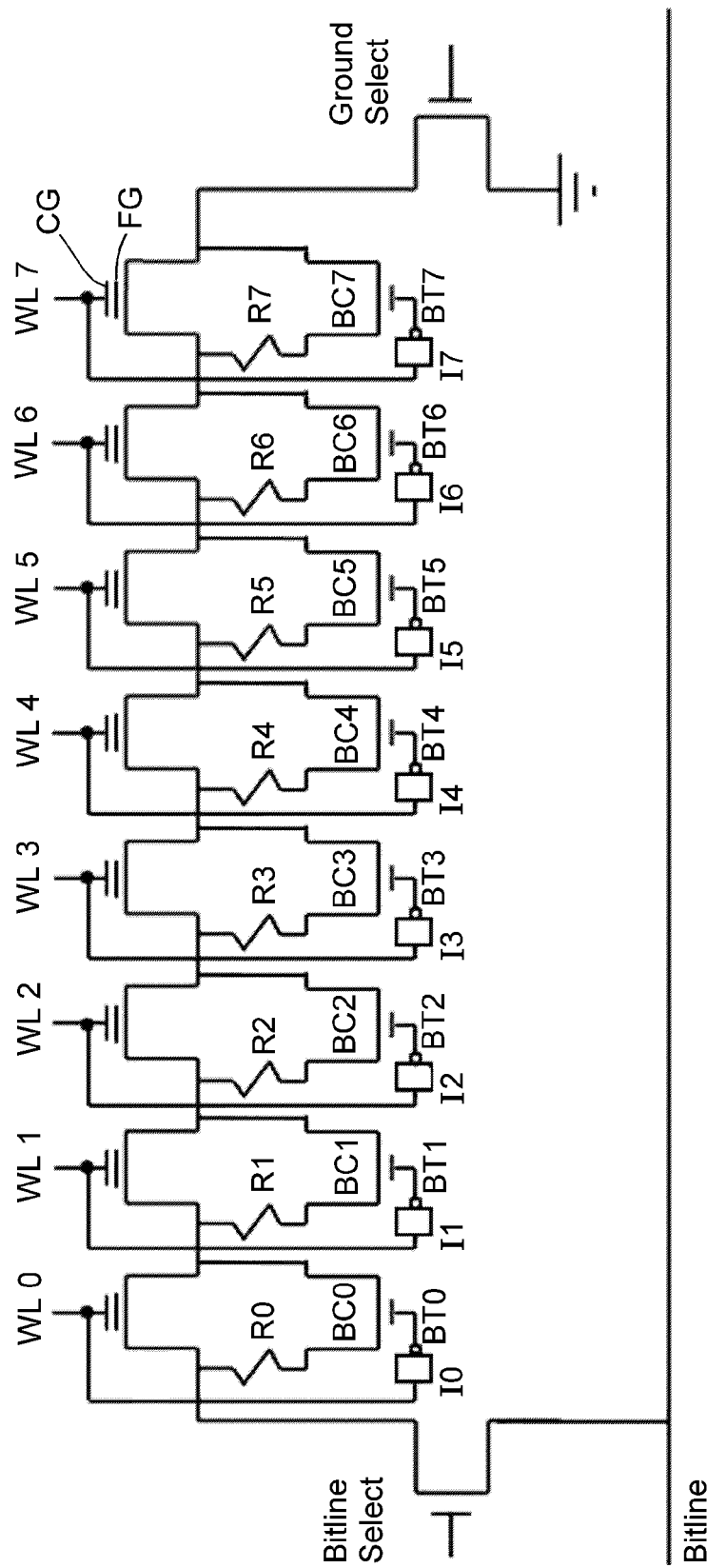
FIG. 2 schematically represents a NAND flash page in which an erase voltage can be modulated so that the voltage applied to each memory cell can be reduced or otherwise depends on the existing charge level on its floating gate.

As a solution to the above, the present invention provides the capability of modulating the erase pulse according to the programming level of each cell within a page of a NAND flash memory device. As an example, FIG. 2 schematically represents a NAND flash page in which an erase voltage applied to each memory cell can be modulated by activating a bypass circuitry (BC0 . . . BC7) associated with each cell. Each bypass circuitry is individually connected to one of the wordlines (WL0 . . . WL7), so that the activation of each bypass circuitry depends on the wordline voltage of each individual memory cell, shown as being arranged in a daisy chain of cells within a page. More particularly, each bypass circuitry operates to reduce or otherwise modulate the erase voltage applied to its corresponding memory cell of the page based on the existing charge level on its floating gate (FG). In short, the programming charge of a cell determines the control voltage at which the floating gate (FG) is turned "On" and, therefore, the necessary voltage level for switching "On" the floating gate is the bit value of the memory cell. Because the electron injection into the floating gate counteracts the positive voltage applied to the control gate (CG), a higher level of programming charge in a floating gate requires a higher control voltage to turn the gate "On."

As represented in FIG. 2, one way of reducing the voltage applied to a cell is to utilize Ohm's law to decrease resistance by adding a parallel circuitry to the cell. In this case, each floating gate transistor has a bypass circuitry that is controlled by the control voltage applied to the control gate. In FIG. 2, the bypass circuitry is turned "On" when the control voltage is low, and includes a CMOS inverter (I0 . . . I7) to invert the level of the control voltage. A resistor (R0 . . . R7) may be inserted into the bypass to regulate the residual voltage level applied to the floating gate transistor (cell).

If the floating gate of the cell has a high charge of electrons, a high control voltage is required. This high control voltage is inverted to an "Off" signal using the CMOS inverter so that, if a high control voltage is sensed during a read (in other words, above a predetermined threshold level), the bypass circuitry is turned OFF and a full erase voltage is applied to the floating gate. On the other hand, if a low charge is present on the cell's floating gate, the control voltage on the word line is low (in other words, below the threshold level), which is translated into an "On" signal on the CMOS inverter, which then closes a bypass transistor (BT0 . . . BT7) within the bypass circuitry. Consequently, the erase voltage applied to the cell is lower in proportion to the resistance of the resistor in the bypass circuitry.

While certain components are shown and preferred for the flash memory device of this invention, it is foreseeable that functionally-equivalent components could be used or subsequently developed to perform the intended functions of the disclosed components. In particular, flash memory devices could be fabricated to contain bypass circuitries that contain various electrical components in addition to or other than those shown in FIG. 2. Therefore, while the invention has been described in terms of a preferred embodiment, it is apparent that other forms could be adopted by one skilled in the art, and the scope of the invention is to be limited only by the following claims.

The invention claimed is:

1. A NAND flash memory device having a memory cell comprising a floating gate, a control gate connected to a wordline and receiving a control voltage therefrom to induce a programming charge on the floating gate, a bitline adapted to apply an erase voltage to deplete the floating gate of the programming charge and thereby restore the floating gate to a nominal erased stated thereof, and means for modulating the erase voltage according to the level of the programming charge on the floating gate, the modulating means avoiding deep depletion or over-erasing of the floating gate by only subjecting the memory cell to a pulse at a level of the erase voltage needed to restore the nominal erased state.

2. The NAND flash memory device according to claim 1, wherein the NAND flash memory device comprises a plurality of memory cells, and each of the memory cells comprises a floating gate, control gate, wordline, bitline, and modulating means as recited in claim 1.

3. The NAND flash memory device according to claim 1, wherein the modulating means comprises a bypass circuitry that is activated and de-activated according to the level of the programming charge on the floating gate, and the bypass circuitry decreases the erase voltage when activated.

4. The NAND flash memory device according to claim 3, wherein the NAND flash memory device comprises a plurality of memory cells, each of the memory cells comprises a floating gate, control gate, wordline, bitline, and modulating means as recited in claim 1, and each of the bypass circuitries decreases the erase voltage of the memory cell thereof when activated.

5. The NAND flash memory device according to claim 3, wherein the bypass circuitry is activated by a transistor.

6. The NAND flash memory device according to claim 5, further comprising a CMOS inverter that inverts the control voltage to turn the transistor "on" if the control voltage is below a threshold level.

7. The NAND flash memory device according to claim 6, wherein the CMOS inverter inverts the control voltage to turn the transistor "off" if the control voltage is above the threshold level.

8. A method of operating a NAND flash memory device having a memory cell comprising a floating gate, a control gate connected to a wordline to receive a control voltage therefrom and induce a programming charge on the floating gate, and a bitline adapted to apply an erase voltage to deplete the floating gate of the programming charge and thereby restore the floating gate to a nominal erased stated thereof, the method comprising decreasing the erase voltage if the control voltage is below a threshold level to avoid over-erasing of the floating gate by only subjecting the memory cell to a pulse at a level of the erase voltage needed to restore the nominal erased state.

9. The method according to claim 8, wherein the NAND flash memory device comprises a plurality of memory cells, and each of the memory cells comprises a floating gate, control gate, wordline and bitline as recited in claim 8, and the method comprises individually decreasing the erase voltage applied to any of the memory cells if the control voltage of the memory cell is below the threshold level.

10. The method according to claim 8, wherein the step of decreasing the erase voltage is performed with a bypass circuitry that is activated and de-activated according to the level of the programming charge on the floating gate, and the bypass circuitry decreases the erase voltage when activated.

11. The method according to claim 10, wherein the NAND flash memory device comprises a plurality of memory cells, each of the memory cells comprises a floating gate, control gate, wordline, and bitline as recited in claim 8, and each of the bypass circuitries decreases the erase voltage of the memory cell thereof when activated.

12. The method according to claim 10, wherein the bypass circuitry is activated by a transistor.

13. The method according to claim 12, further comprising a CMOS inverter that inverts the control voltage to turn the transistor "on" if the control voltage is below a threshold level.

14. The method according to claim 13, wherein the CMOS inverter inverts the control voltage to turn the transistor "off" if the control voltage is above the threshold level.

15. A NAND flash memory device having a plurality of memory cells, each of the memory cells comprising a floating gate, a control gate connected to a wordline and adapted to receive a control voltage therefrom to induce a programming charge on the floating gate, a bitline adapted to apply an erase voltage to deplete the floating gate of the programming charge, and means for modulating the erase voltage according to the level of the programming charge on the floating gate of each of the memory cells.

16. A NAND flash memory device having a memory cell comprising a floating gate, a control gate connected to a wordline and adapted to receive a control voltage therefrom to induce a programming charge on the floating gate, a bitline adapted to apply an erase voltage to deplete the floating gate of the programming charge, and means for modulating the erase voltage according to the level of the programming charge on the floating gate, wherein the modulating means comprises a bypass circuitry that is activated and de-activated according to the level of the programming charge on the floating gate, the bypass circuitry is individually connected to the wordline of the memory cell so that the bypass circuitry is activated depending on the control voltage on the wordline of the memory cell, and the bypass circuitry decreases the erase voltage when activated based on the programming charge on the floating gate.

17. The NAND flash memory device according to claim 16, wherein the NAND flash memory device comprises a plurality of memory cells, each of the memory cells comprises a floating gate, control gate, wordline, bitline, and modulating means as recited in claim 16, and each of the bypass circuitries decreases the erase voltage of the memory cell thereof when activated.

18. A method of operating a NAND flash memory device having a plurality of memory cells, each of the memory cells comprising a floating gate, a control gate connected to a wordline to receive a control voltage therefrom and induce a programming charge on the floating gate, and a bitline adapted to apply an erase voltage to deplete the floating gate of the programming charge, the method comprising decreasing the erase voltage if the control voltage is below a threshold level to avoid over-erasing of the floating gate of each of the memory cells.

19. A method of operating a NAND flash memory device having a memory cell comprising a floating gate, a control gate connected to a wordline to receive a control voltage therefrom and induce a programming charge on the floating gate, and a bitline adapted to apply an erase voltage to deplete the floating gate of the programming charge, the method comprising decreasing the erase voltage if the control voltage is below a threshold level to avoid over-erasing of the floating gate of each of the memory cells, wherein the step of decreasing the erase voltage is performed with a bypass circuitry that is activated and de-activated according to the level of the programming charge on the floating gate, the bypass circuitry is individually connected to the wordline of the memory cell so that the bypass circuitry is activated depending on the control voltage on the wordline of the memory cell, and the bypass circuitry decreases the erase voltage when activated based on the programming charge on the floating gate.

20. The method according to claim 19, wherein the NAND flash memory device comprises a plurality of memory cells, and each of the memory cells comprises a floating gate, control gate, wordline and bitline as recited in claim 19, and the method comprises individually decreasing the erase voltage applied to any of the memory cells if the control voltage of the memory cell is below the threshold level.

* * * * *